United States Patent [19]
Seki

[11] Patent Number: 5,281,873
[45] Date of Patent: Jan. 25, 1994

[54] SENSE AMPLIFIER CONTROL CIRCUIT

[75] Inventor: Teruo Seki, Kasugai, Japan

[73] Assignees: Fujitsu Limited, Kawasaki; Fujitsu VLSI Limited, Kasugai, both of Japan

[21] Appl. No.: 62,167

[22] Filed: May 17, 1993

Related U.S. Application Data

[63] Continuation of Ser. No. 721,622, Jul. 19, 1991, abandoned.

[30] Foreign Application Priority Data

Nov. 21, 1989 [JP] Japan ................................. 1-302937

[51] Int. Cl.$^5$ ........................ H03K 17/60; H03F 3/45
[52] U.S. Cl. .................................. 307/530; 307/260; 307/264; 307/296.1; 307/296.3; 307/570
[58] Field of Search ............... 307/530, 260, 264, 268, 307/296.3, 355, 362, 570, 446, 296.1

[56] References Cited

U.S. PATENT DOCUMENTS

| | | | |
|---|---|---|---|
| 4,099,070 | 7/1978 | Reinert | 307/238 |
| 4,849,661 | 7/1989 | Bazes | 307/296.8 |
| 4,987,327 | 1/1991 | Fernandez et al. | 307/491 |

FOREIGN PATENT DOCUMENTS

| | | |
|---|---|---|
| 69588A3 | 1/1983 | European Pat. Off. . |
| 57-69590 | 4/1982 | Japan . |
| 58-77092 | 5/1983 | Japan . |
| 59-56289 | 3/1984 | Japan . |
| 60-136084 | 7/1985 | Japan . |

Primary Examiner—Margaret R. Wambach
Attorney, Agent, or Firm—Nikaido, Marmelstein, Murray & Oram

[57] ABSTRACT

A sense amplifier control circuit controls the activation and deactivation of sense amplifiers without a lo .. ing of the operation speed of the sense amplifiers, correctly carries out a control operation without malfunctions, and is suitable for highly integrated circuits. The control circuit comprises a control unit, and each of the sense amplifiers comprises a pair of transistors forming a differential pair and a constant current source transistor connected to a common node of the differential pair. The control unit is connected to the constant current source transistors and generates a constant current source control signal in response to control signal indicating an activation or deactivation of the differential amplification operation of each differential pair.

8 Claims, 6 Drawing Sheets

SENSE AMPLIFIER CONTROL CIRCUIT

This application is a continuation of application Ser. No. 07/721,622 filed Jul. 19, 1991 now abandoned.

TECHNICAL FIELD

The present invention relates to a sense amplifier control circuit, and more particularly, to a control circuit suitable for collectively activating and deactivating a plurality of sense amplifiers each comprising a pair of bipolar-emitter-follower-type differential transistors.

BACKGROUND ART

In a large capacity semiconductor memory, a memory cell array is divided into several blocks and non-selected blocks are deactivated, to reduce power consumption. Namely, only a block to be read or written is activated, and thus the sense amplifiers of the other blocks do not consume electric power. This power saving effect is particularly conspicuous in a large capacity semiconductor memory.

FIG. 6 shows an essential part of a block of a conventional semiconductor memory. Reference symbols A1 to An denote sense amplifiers each comprising a pair of bipolar-emitter-follower-type differential transistors, and numeral 1 denotes a bias voltage generator circuit. Each of the sense amplifiers A1 to An amplifies the potential difference of a pair of bit lines (not shown), and supplies the amplified difference as, for example, memory cell data.

FIG. 7 shows a differential amplifier circuit in the conventional sense amplifier (for example, A1). The sense amplifier A1 comprises transistors T1 and T2. The collectors of the transistors T1 and T2 are connected to an H-level power source Vcc through resistors R1 and R2, respectively, and the emitters thereof are commonly connected to an L-level power source line Vss through a current control element T3 and a switching element T4. IN and $\overline{\text{IN}}$ denote input signals, and OUT and $\overline{\text{OUT}}$ denote output signals.

In FIG. 8, the bias voltage generator circuit 1 comprises, for example, resistors R3 and R4 connected in series between Vcc and Vss, and a bipolar transistor T3 and a MOS transistor T6 also connected in series. The voltage Vcc is divided by the resistors R3 and R4 to provide a base potential for the transistors R3 and R4 to provide a base potential for the transistor T5, and the emitter of the transistor T5 provides a reference voltage VB having a constant potential.

In FIG. 7, when the transistor T4 is ON, emitter currents IE1 and IE2 of a pair of the bipolar transistors T1 and T2 flow (as a constant current IO) through the transistors T3 and T4, and when a predetermined activating/deactivating signal CONT is externally set to a level L, the transistor T4 is turned OFF to stop the flow of the current IO and deactivate the differential amplifier A1.

Namely, to deactivate the sense amplifiers of the semiconductor memory block by block, the signal CONT is set to the level L and commonly supplied to each of the sense amplifiers A1 to An of FIG. 6.

According to this prior art, each of the sense amplifiers A1 to An must have the switching element T4, which is turned ON and OFF according to the signal CONT, and as a result, this prior art has the following problems:

(i) The transistor T4 causes a channel resistance that slightly increases a node potential (VN in FIG. 7) between transistors T3 and T4, and this increases the reference potential of the transistor T3 to thereby reduce the current IO and lower the operation speed of the differential pair of transistors of the sense amplifier.

(ii) To deal with the above problem (i), the area of the transistor T4 can be increased to thus reduce the channel resistance. In practice, the area is increased four times in each differential amplifier, and therefore, each transistor T4 needs four times as large an area as required by a normal transistor, and thus an integrated circuit involving n differential amplifiers may require an area increase of "4×n" transistors, which will hinder circuit integration.

DISCLOSURE OF THE INVENTION

An object of the invention is to provide a sense amplifier control circuit that does not lower the operation speed of sense amplifiers, provides a stabilized constant current, causes substantially no malfunction, and is suitable for circuit integration.

To achieve this object, a sense amplifier control circuit according to the invention basically comprises a control means connected to a constant current source transistor of a sense amplifier. The sense amplifier includes a pair of transistors forming a differential pair, and a constant current source transistor connected to a common node of the differential pair. The control means generates a constant current source control signal in response to a control signal, to indicate the activation or deactivation of the differential amplification operation of the differential pair.

FIG. 1 shows a basic arrangement of the invention. In the figure, a pair of transistors T1 and T2 form a differential pair in a sense amplifier A1, and a constant current source transistor T3 is connected to a common node 0 of the differential pair. A bias voltage generating means 2 applies a bias voltage to a control electrode of the constant current source transistor T3. The bias voltage generating means 2 switches the bias voltage in response to a control signal (hereinafter referred to as the differential pair control signal) to indicate the activation or deactivation of the differential amplification operation of the differential pair of the sense amplifier A1.

Upon receiving a differential pair control deactivation signal, the bias voltage generating means (corresponding to the bias voltage generator circuit 1 of the prior art) provides an output voltage (a bias voltage) having a predetermined potential, which controls emitter currents of the bipolar transistors T1 and T2 of the sense amplifier to 0.

Since the invention does not require the switching element (T4), which occupies a large area in each sense amplifier, no lowering of the operation speed occurs according to the invention. Also, since the invention requires that only one potential setting means be provided for each group of sense amplifiers, the invention will not increase the size of a circuit, and therefore, is appropriate for circuit integration.

BRIEF DESCRIPTION OF THE DRAWINGS

FIGS. 2 to 5 are views showing embodiments of a sense amplifier control circuit according to the invention, in which, FIG. 2 is a schematic view showing the essential part of a block of a semiconductor memory employing the sense amplifier control circuit according to the invention;

FIG. 3 is a view showing a sense amplifier with a MOS transistor as a current control element; and FIGS. 4 and 5 are views showing embodiments of the sense amplifier control circuit according to the invention;

BEST MODE OF CARRYING OUT THE INVENTION

Figure 1:
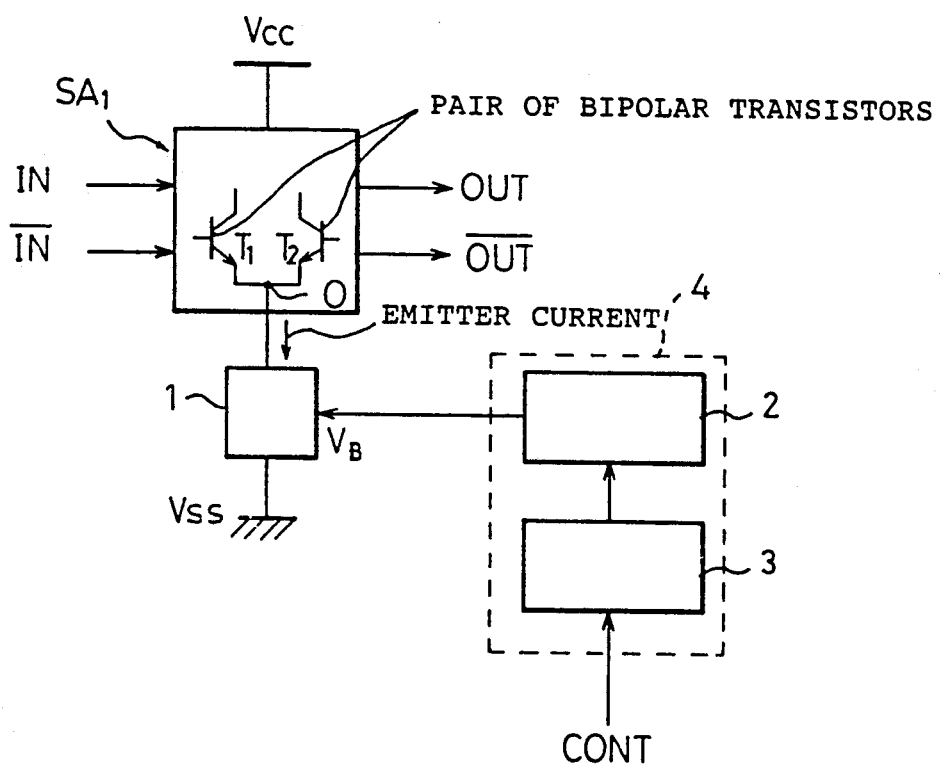
FIG. 1 is a schematic view showing a principle of the invention.
Figure 2:
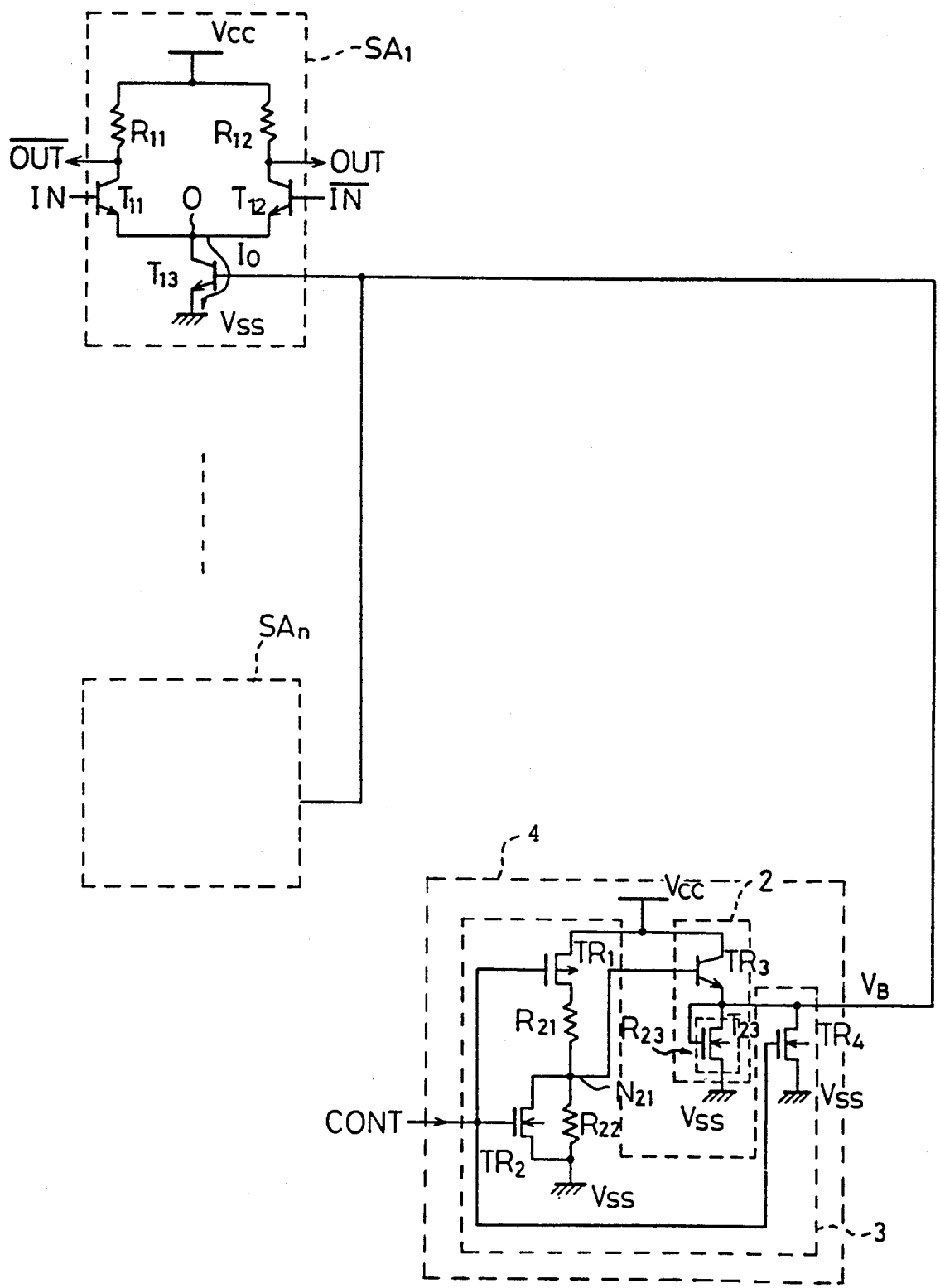

Embodiments of a sense amplifier control circuit according to the invention will be explained in detail with reference to the drawings. In FIG. 2, the sense amplifier control circuit according to the invention controls a sense amplifier SA1. This sense amplifier includes a pair of transistors T11 and T12 forming a differential pair, and a constant current source transistor T13 forming a constant current source 1 connected to a common node 0 of the differential pair. The constant current source transistor T13 is connected to a control means 4 generating a constant current source control signal in response to a differential pair control signal (CONT), to indicate the activation or deactivation of the differential amplification operation of the differential pair.

The invention will be explained in more detail.

FIG. 2 to 5 show embodiments of the sense amplifier control circuit according to the invention applicable for a semiconductor memory.

In FIG. 2, SA1 to SAn denote n sense amplifiers contained in each of blocks divided from a memory cell array. Each sense amplifier (for example, SA1) comprises a pair of bipolar transistors T11 and T12 forming a bipolar-emitter-follower-type differential amplification pair. The collectors of the transistors T11 and T12 are connected ton an H-level power source Vcc through resistors R11 and R12, respectively, while the emitters thereof are connected to a common node 0, which is connected to an L-level power source Vss through a bipolar transistor T13 serving as a constant current source. IN and IN denote input signals, and OUT and OUT output signals.

Numeral 4 denotes a differential pair control means shared by a group of sense amplifiers SA1 to SAn. The control means 4 controls the activation and deactivation of the differential pair, and comprises a bias voltage generating means 2 and a differential pair control signal generating means 3.

Namely, the control means according to the invention serves as the bias voltage generating means for the constant current source.

Preferably, the control means according to the invention has a constant current source control signal generating means for generating a constant current source control signal in response to the control sinal, to indicate the activation or deactivation of the differential amplification operation of the differential pair, as well as a bias voltage generating means.

More precisely, the control means of the sense amplifiers according to the invention comprises:

a first transistor TR1 having a terminal connected to a first power source, for example, Vcc, another terminal connected to a second power source, for example, Vss through series connected first and second resistor means R21 and R22, and a control terminal for receiving the differential pair control signal;

a second transistor TR2 having a terminal connected to a node of the first and second resistor means R21 and R22, another terminal connected to the second power source Vss, and a control terminal for receiving the differential pair control signal;

a third transistor TR3 having a terminal connected to the first power source Vcc, another terminal connected to the second power source Vss through a third resistor means R23, and a control terminal for receiving a voltage signal from the node between the first and second resistor means R21 and R22; and a fourth transistor TR4 having a terminal connected to a control terminal of the constant current source transistor T13 as well as to a node between the third transistor TR3 and the third resistor means R23, another terminal connected to the second power source Vss, and a control terminal for receiving the differential pair control signal.

The first to fourth transistors forming the control means 4 of the sense amplifier control circuit according to the invention may be bipolar transistors, MOSFETs, or a combination thereof.

For example, the third transistor TR3 may be a bipolar transistor, and the other transistors TR1, TR2, TR4, etc., may be MOSFETs.

The resistor means of the control means according to the invention may be standard transistors, or MOSFETs. For example, the third resistor means may be a MOSFET.

The control means 4 according to the invention shown in FIG. 2 will be explained in detail.

Connected in series between the first H-level power source Vcc and the second L-level power source, Vss, are the first MOS transistor TR1 and the resistors R21 and R22, as well as the third bipolar transistor TR3 and the third resistor means R23 which is a MOS transistor T23. The second MOS transistor TR2 is connected in parallel with the resistor R22, and the fourth MOS transistor TR4 is connected in parallel with the transistor T23. A node N21 between the first and second resistors R21 and R22 is connected to the base of the transistor TR3. The gates of the transistors T21, T24, and T25 commonly receive the predetermined activation and deactivation instruction signal CONT.

When the signal CONT is L level (for instructing the differential amplifiers to operate normally), the first transistor TR1 is turned ON, and the second and fourth transistors TR2 and TR4 are turned OFF. As a result, the control means 4 generates a bias voltage VB of constant potential, which is equal to the potential of the node N21 minus a threshold voltage Vth of the third transistor TR3. Flowing through the transistor T13 of, for example, the sense amplifier SA1, is a resultant current IO of emitter currents of the transistors T11 and T12. The current IO is constant due to the bias voltage VB. A pair of the bipolar transistors T11 and T12, therefore, normally amplifies a voltage difference of input signals IN and IN, and provides output signals OUT and OUT.

When the signal CONT is H level (for instructing the differential amplifiers to be deactivated), the first transistor TR1 is turned OFF, and the second and fourth transistors TR2 and TR4 ON. Since the first transistor TR1 is turned OFF, the node N21 is disconnected from the first power source Vcc, and since the second transistor TR2 is ON, the potential of the node N21 is rapidly reduced to the potential of the second power source Vss. As a result, the third transistor TR3 is turned OFF at once, and the fourth transistor T25 is turned ON to rapidly change the potential of the bias voltage VB to Vss.

Namely, when the differential pair control signal (CONT) is changed from L to H, the bias voltage VB is changed to the potential of the second power source Vss (for example, OV), which is a predetermined potential. When VB=OV, the transistor T13 of the sense amplifier SA1 is turned OFF, and accordingly, the emitter currents of the bipolar transistors T11 and T12 are each controlled to 0, and as a result, the sense amplifier is deactivated.

Figure 7:
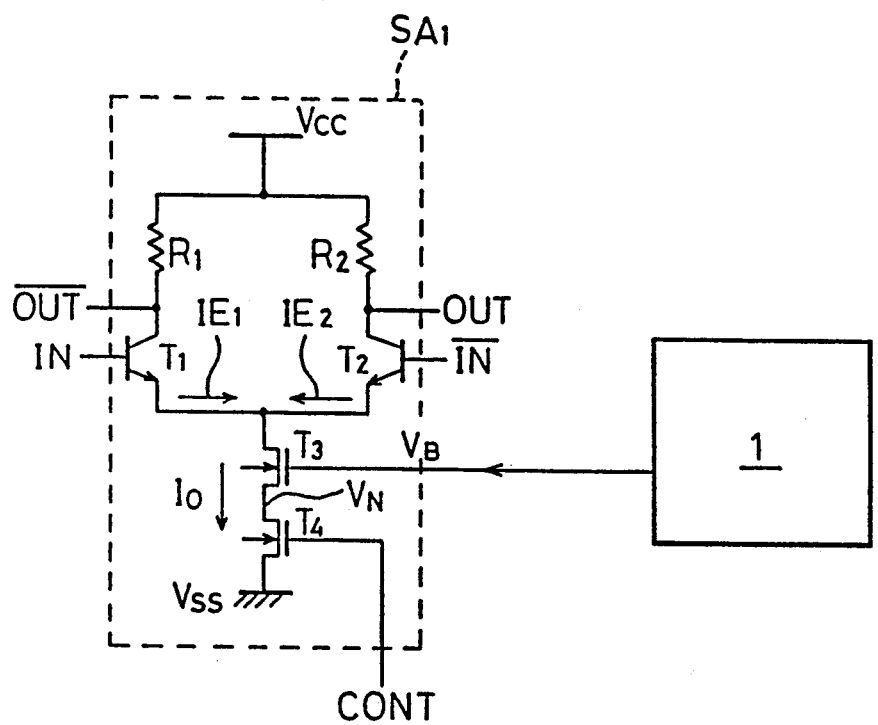
FIG. 7 is a schematic view showing a sense amplifier of FIG. 6.
Figure 8:
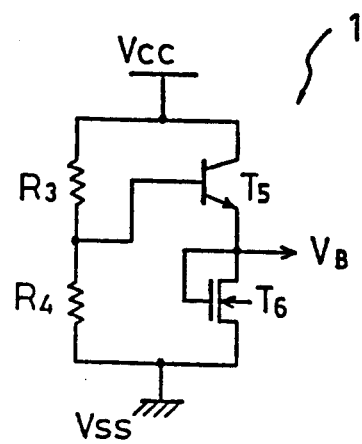
FIG. 8 is a schematic view showing a bias voltage generator circuit of FIG. 6.

In this way, according to this embodiment, the bias voltage VB is changed to the predetermined potential of 0 when the level of the differential pair control signal (CONT) for the sense amplifiers is changed from L to H, and therefore, it is not necessary to arrange a switching element (T4 of FIG. 7) for each sense amplifier. A reference potential for the transistor T13 is always set to Vss (ground potential) to maintain the current IO at a constant value without reducing the same, to thereby avoid a lowering of the speed of the sense amplifiers.

This embodiment may be achieved by only adding the control signal generating means 3 (composed of the transistors TR1, TR2, and TR4 in FIG. 2) to the standard bias voltage generator circuit 2. The control signal generating means 3 can be shared by a group of sense amplifiers SA1 to SAn. Namely, only three additional transistors (TR1, TR2, and TR4) are needed for each group of sense amplifiers, and as this number is much smaller than the number of transistors required for each block of the prior art, the embodiment is, therefore, suitable for high integration.

Figure 3:
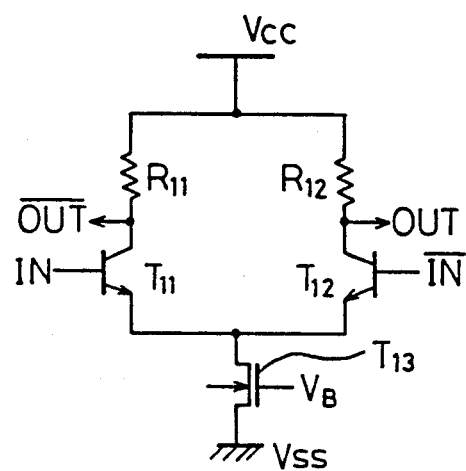

Although the embodiment employs the bipolar transistor T13 as the constant current means 1 of each sense amplifier, this does not limit the invention. For example, the invention may employ a MOS transistor T13', as shown in FIG. 3.

Various modifications are possible for the differential control means 4 of the invention.

For example, the first transistor TR1 may be a bipolar transistor, the first resistor means R21 omitted, and the emitter of the bipolar transistor connected to the second resistor means R22.

Also, the third transistor TR3 may be formed with a MOSFET and a fourth resistor means R24, with the base terminal of the transistor TR3 receiving the differential pair control signal. The third resistor means R23 may be formed with a bipolar transistor T22 and a fifth resistor means R25, with the base terminal of the transistor T22 receiving a voltage signal provided from the node N21 between the first and second resistor means R21 and R22.

The details of the modifications will be explained with reference to FIGS. 4 and 5.

Figure 4:
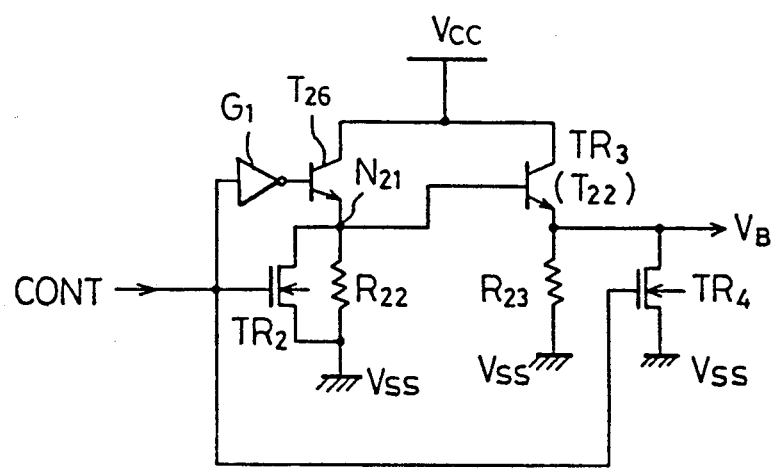

In the control means 4 of FIG. 4, the transistor T23 of FIG. 2 is replaced with a resistor R23, and the first transistor TR1 of FIG. 2 with a bipolar transistor T26. The base of the transistor T26 receives the activation and deactivation control signal CONT through an inventer gate G1. The modification of FIG. 4 provides the same function as that provided by the embodiment of FIG. 2. In FIG. 4, a control signal is taken out of the bias voltage generator circuit by a bipolar technique, not the resistor dividing technique.

Figure 5:
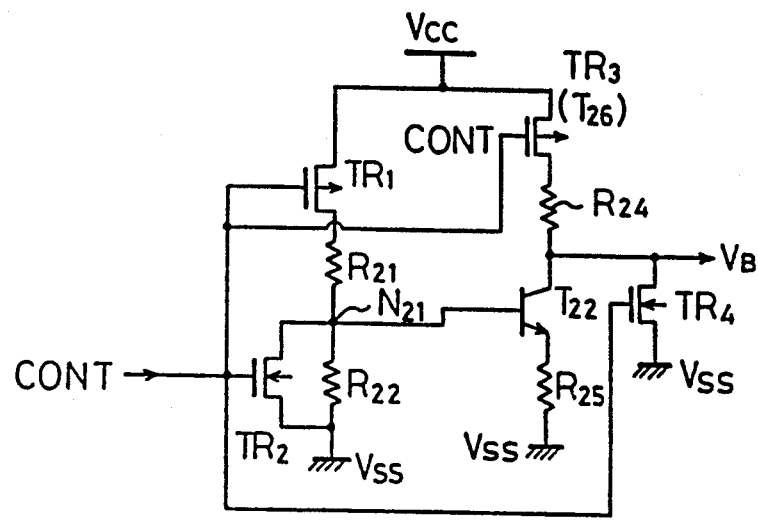
Figure 6:
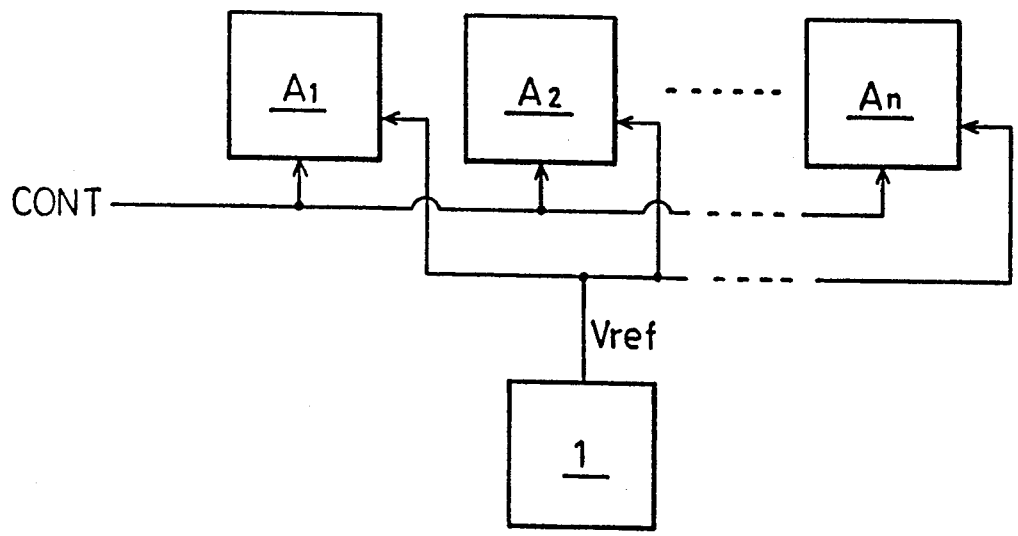
FIG. 6 is a schematic view showing one block of a conventional semiconductor memory.

In the control means 4 of FIG. 5, the transistor T23 of FIG. 2 serving as the third resistor means is replaced with a bipolar transistor T22 and a resistor R25 as a fifth resistor means connected in series to the emitter of the transistor T22 and the third transistor TR3 with a MOSFET T26 and a resistor R24 as a fourth resistor means. The base terminal of the bipolar transistor T22 receives a voltage signal from the node N21 between the first and second resistor means R21 and R22. The gate of the MOSFET T26 as the third transistor TR3 receives the differential control signal. In this arrangement, the bias voltage VB is provided from the collector of the bipolar transistor T22. This modification provides the same effect as that provided by the arrangement of FIG. 2, and is suitable for providing a higher VB.

The predetermined potential of VB is OV in the above embodiments, but may be any value that will turn OFF the current control elements (bipolar transistors or MOS transistors) of the sense amplifiers SA1 to SAn.

In the example of FIG. 4 of the invention, the third transistor TR3 is the bipolar transistor T22. This arrangement provides a relative increase of the driving capacity and lowers the bias voltage VB, compared with Vcc. For example, when Vcc is 5 V, the bias voltage VB will about 2 V.

This voltage level is appropriate for controlling the transistor T13 that forms the constant current source circuit of the sense amplifier.

On the other hand, the circuit arrangement of FIG. 5 usually shifts the bias voltage VB toward Vcc. For example, when Vcc is 5 V, VB will be about 3.5 V.

Since the circuit of FIG. 5 uses MOSFETs and bipolar transistors together, changes in the properties thereof due to temperature changes may be mutually compensated, to thereby obtain a more accurate control.

The embodiment of FIG. 4 is applicable to a sense amplifier, etc., as the bias voltage VB is thus set to about 2 V.

The embodiment of FIG. 5 is applicable to a clamper as the bias voltage VB is thus set to about 3.5 V.

Figure 9:
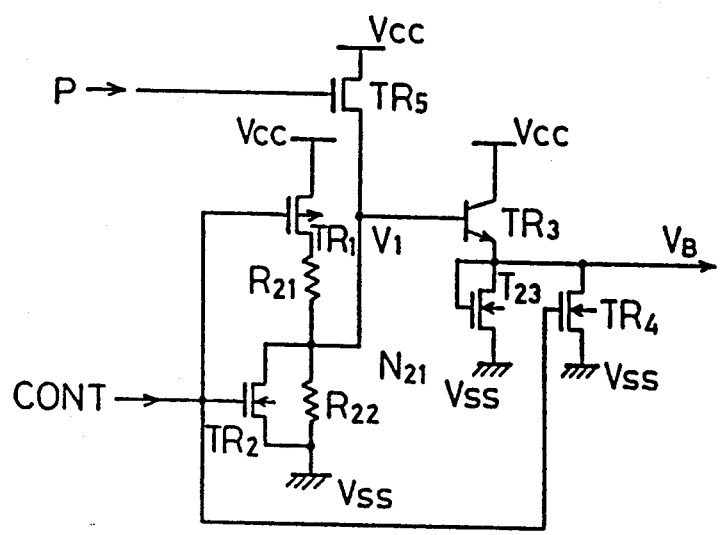
FIG. 9 is a view showing another embodiment of the sense amplifier control circuit according to the invention.

FIG. 9 shows another embodiment of the invention.

A control circuit of FIG. 9 comprises, in addition to the basic circuit of FIG. 2, a fifth transistor TR5. The fifth transistor TR5 has a terminal connected to the control terminal of the third transistor TR3, another terminal connected to the first power source Vcc, and a control terminal for receiving a pulse signal responding to the differential pair control signal.

The fifth transistor TR5 of this embodiment may be a bipolar transistor or a MOSFET.

This MOSFET is positively driven by a pulse and supplies a voltage to the base of the third bipolar transistor TR3, to thereby accelerate the rising speed of the bipolar transistor.

Usually, a response signal V1 of the differential pair control signal (CONT) is provided from one terminal of the second transistor TR2, i.e., from the node N21 between the first and second resistor means R21 and R22. Due to wiring capacitance from the node N21 to the bipolar transistor T22, i.e., the third transistor TR3 and due to the driving capacity of the transistor T22, the bias voltage VB is blunted and delayed with respect to the response signal V1.

When the control signal (CONT) is provided with a logic such that an L-level of the control signal (CONT) turns ON the constant current source transistor T13, an H-level pulse P is applied to the gate of the MOSFET TR5, to thereby momentarily pull up the bipolar transistor to a high potential state, and thus synchronize a rise of VB with a rise of V1.

The width of the pulse P can be ignored, even if is short, as it is sufficient to recover the delay of the rise of the bias voltage VB in the conventional circuit.

EFFECT OF THE INVENTION

The invention can omit one of transistors of a constant current source circuit of a sense amplifier, to thereby reduce the size of the sense amplifier, and thus the invention is suitable for a circuit having a high density and high integration. A sense amplifier control circuit according to the invention correctly and constantly provides the sense amplifier with a predetermined constant current, to thereby ensure a correct detection operation of the sense amplifier, and prevent a malfunction of the sense amplifier.

I claim:

1. A sense amplifier control circuit comprising a control means for controlling sense amplifiers each having a pair of transistors forming a differential pair, and a constant current source transistor for forming a constant current source connected to a common node of the differential pair, the control means being connected to the constant current source transistor and serving as a bias voltage generating means for the constant current source transistor to generate a bias voltage in response to a control signal which controls an activation or deactivation of the differential amplification operation of the differential pair, so that said constant current source transistor serves as a constant current source when said controlling signal shows said activation condition of said differential pair, and said control means generates a voltage to cut off said constant current source transistor when said controlling signal shows said deactivation thereof.

2. A sense amplifier control circuit as set forth in any one of claim 1, wherein the control means comprises:
a first transistor having a terminal connected to a first power source, another terminal connected to a second power source through series connected first and second resistor means, and a control terminal for receiving the differential pair control signal;
a second transistor having a terminal connected to a node between the first and second resistor means, another terminal connected to the second power source, and a control terminal for receiving the differential pair control signal;
a third transistor having a terminal connected to the first power source, another terminal connected to the second power source through a third resistor means, and a control terminal for receiving a voltage signal from the node between the first and second resistor means; and
a fourth transistor having a terminal connected to a control terminal of the constant current source transistor as well as to a node between the third transistor and the third resistor means, another terminal connected to the second power source, and a control terminal for receiving the differential pair control signal.

3. A sense amplifier control circuit as set forth in claim 2, wherein the third transistor is a bipolar transistor, and the other transistors are MOSFETs.

4. A sense amplifier control circuit as set forth in claim 2, wherein the third resistor is a MOSFET.

5. A sense amplifier control circuit as set forth in claim 2, wherein the first transistor is a bipolar transistor, the first resistor means is omitted, and the emitter of the bipolar transistor is connected to the second resistor means.

6. A sense amplifier control circuit as set forth in claim 3, wherein the third transistor comprises a MOSFET and a fourth resistor means, with the base terminal of this MOSFET receiving the differential pair control signal, and the third resistor means comprises a bipolar transistor and a fifth resistor means, with the base terminal of this bipolar transistor receiving a voltage signal from the node between the first and second resistor means.

7. A sense amplifier control circuit as set forth in claim 3, further comprising a fifth transistor having a terminal connected to the control terminal of the third transistor, another terminal connected to the first power source, and a control terminal for receiving a pulse signal that responds to the differential pair control signal.

8. A sense amplifier control circuit comprising a control means for controlling sense amplifiers each having a pair of transistors forming a differential pair, and a constant current source transistor for forming a constant current source connected to a common node of the differential pair, the control means being connected to the constant current source transistor and generating a bias voltage in response to a control signal which controls an activation or deactivation of the differential amplification operation of the differential pair, so that said constant current source transistor serves as a constant current source when said controlling signal shows said activation condition of said differential pair, and said control means generates a voltage to cut off said constant current source transistor when said controlling signal shows said deactivation thereof, wherein said control means further comprises:
a first transistor having a terminal connected to a first power source, another terminal connected to a second power source through series-connected first and second resistor means, and a control terminal for receiving the differential pair control signal;
a second transistor having a terminal connected to a node between the first and second resistor means, another terminal connected to the second power source, and a control terminal for receiving the differential pair control signal;
a third transistor having a terminal connected to the first power source, another terminal connected to the second power source through a third resistor means, and a control terminal for receiving a voltage signal from the node between the first and second resistor means; and
a fourth transistor having a terminal connected to a control terminal of the constant current source transistor as well as to a node between the third transistor and the third resistor means, another terminal connected to the second power source, and a control terminal for receiving the differential pair control signal.

* * * * *

UNITED STATES PATENT AND TRADEMARK OFFICE
CERTIFICATE OF CORRECTION

PATENT NO. : 5,281,873
DATED : January 25, 1994
INVENTOR(S) : Teruo SEKI

It is certified that error appears in the above-identified patent and that said Letters Patent is hereby corrected as shown below:

On the title page, Item [63], after "abandoned" insert -- filed as PCT/JP90/01524 on November 21, 1990, published as WO91/07757 on May 5, 1991. --

Signed and Sealed this

Thirteenth Day of December, 1994

Attest:

BRUCE LEHMAN

Attesting Officer     Commissioner of Patents and Trademarks